United States Patent
Deng et al.

(10) Patent No.: US 10,816,602 B2
(45) Date of Patent: Oct. 27, 2020

(54) METHOD FOR MEASURING BANDWIDTH OF LINEAR MOTOR

(71) Applicant: AAC Technologies Pte. Ltd., Singapore (SG)

(72) Inventors: Hanlin Deng, Shenzhen (CN); Zheng Xiang, Shenzhen (CN); Xiang Lu, Shenzhen (CN)

(73) Assignee: AAC Technologies Pte. Ltd., Singapore (SG)

( * ) Notice: Subject to any disclaimer, the term of this patent is extended or adjusted under 35 U.S.C. 154(b) by 0 days.

(21) Appl. No.: 16/530,964

(22) Filed: Aug. 2, 2019

(65) Prior Publication Data
US 2020/0057109 A1 Feb. 20, 2020

(30) Foreign Application Priority Data

Aug. 14, 2018 (CN) .......................... 2018 1 0919778

(51) Int. Cl.
*G01R 31/34* (2020.01)
*H02P 25/032* (2016.01)

(52) U.S. Cl.
CPC ............ *G01R 31/34* (2013.01); *H02P 25/032* (2016.02)

(58) Field of Classification Search
CPC .............................. H02P 25/032; G01R 31/34
USPC .................................................... 318/490, 34
See application file for complete search history.

(56) References Cited

U.S. PATENT DOCUMENTS 9,797,957 B2 * 10/2017 Lee ...................... G01R 31/343

* cited by examiner

*Primary Examiner* — David Luo
(74) *Attorney, Agent, or Firm* — W&G Law Group LLP

(57) ABSTRACT

The present disclosure provides a method for measuring bandwidth of linear motor, including the following steps: step S1: setting a frequency distribution of an excitation signal; step S2: with reference to a target displacement level, measuring a steady state displacement peak of a motor vibrator at each frequency point of the excitation signal, and obtaining a frequency response curve with reference to the target displacement level; step S3: according to the frequency response curve obtained in step S2, determining an upper frequency limit and a lower frequency limit with reference to the target displacement level, and obtaining a bandwidth of the linear motor by calculating a difference between the upper frequency limit and the lower frequency limit.

10 Claims, 3 Drawing Sheets

METHOD FOR MEASURING BANDWIDTH OF LINEAR MOTOR

FIELD OF THE PRESENT DISCLOSURE

The present disclosure relates to microelectromechanical field, more particularly to a method for measuring a bandwidth of a linear motor.

DESCRIPTION OF RELATED ART

Taking electronic devices such as smart phones, tablet computers as carriers, a touch feedback function thereof brings users' a multi-level and a multi-dimensional touch interactive experience. Typical examples include: vibration experiences related to notices of short messages and incoming calls; time reminding vibration experiences initiated by alarm clocks and calendars; vibration experiences of low battery reminding; and vibration experiences related to movies and game plots.

A linear motor is a core device which provides a touch feedback function. As the requirement for the touch effect design continuously increases, it is necessary to have a deeper and more accurate understanding of the performance of the linear motor itself. In many movies and games, according to needs of specific plots, the degree of richness and fidelity of touch experience are mainly determined by a vibration intensity and a vibration frequency, therefore, when selecting and comparing various kinds of linear motors, users should mainly focus on the broadband signal response capability of the linear motor.

In actual operation, it is difficult to measure the bandwidth of the linear motor. Firstly, the linear motor will heat under a long-time signal exciting, causing parameters of the linear motor to change and to deviate from a linear working area, so that a frequency response model of the linear motor is no longer a linear system. Secondly, a vibrator is packaged in an outer housing of the linear motor so that a dynamic displacement of the vibrator cannot be directly measured. Thirdly, a large amplitude non-resonant frequency signal excites the linear motor, and a displacement peak at an initial phase is likely to exceed an allowable ultimate displacement of the vibrator, and consequently, a steady state displacement peak of the corresponding frequency at a steady phase cannot be measured.

Therefore, it is necessary to provide a new method for measuring the bandwidth of the linear motor to solve the above problems.

DETAILED DESCRIPTION OF THE EXEMPLARY EMBODIMENT

Hereafter, the present disclosure will be further described with reference to the accompanying drawings and embodiment.

The method for measuring a bandwidth of a linear motor of the present embodiment is applied to linear motors equipped in the smart phones and the tablet computers, which can indirectly measure a dynamic displacement based on a calculation relationship between displacement and acceleration in a steady state vibration; and the method can measure the dynamic displacement corresponding to a large non-resonant frequency input signals by eliminating overshoot.

Figure 1:
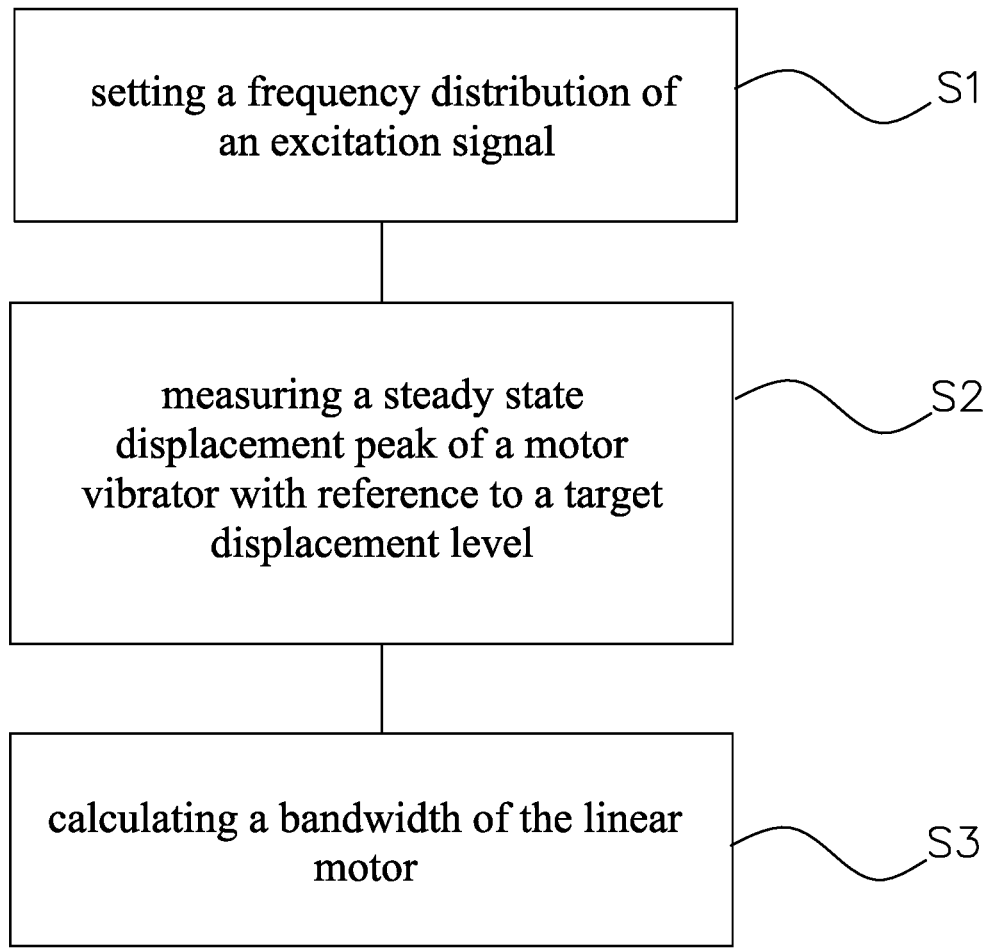
FIG. 1 is a flowchart of a method for measuring a bandwidth of a linear motor according the present disclosure.

As shown in FIG. 1, the method for measuring the bandwidth of the linear motor of the present disclosure comprises the following steps:

step S1: a frequency distribution of an excitation signal is set, a frequency starting point, a frequency ending point, and an interval between two adjacent frequency points are determined, and a detailed list of measuring frequencies is provided;

step S2: according to the list of measuring frequencies provided in step S1, with reference to a target displacement level, a steady state displacement peak of the motor vibrator at each frequency point of the excitation signal corresponding to the list of measuring frequencies is measured; and a frequency response curve with reference to the target displacement level is obtained;

step S3: according to the frequency response curve obtained in step S2, an upper frequency limit and a lower frequency limit with reference to the target displacement level are determined, and the bandwidth of the linear motor is obtained by calculating a difference between the upper frequency limit and the lower frequency limit.

Specifically, in step S1, a preset frequency band to be measured is divided into N segments, and N is an integer greater than 1; and in each segment of the frequency band to be measured, the frequency starting point, the frequency ending point and the interval between adjacent frequency points of the excitation signal are set. Specifically, for example, the frequency band to be measured ranges from 100 Hz to 300 Hz, and the frequency band to be measured is firstly divided into 201 segments, each segment is 1 Hz and then measured in each 1 Hz band. The present invention adopts the method of segmentation measurement, which can prevent the linear motor from heating under a long-time vibration, which causes parameters of the linear motor to change and to deviate from the linear working area, so that the frequency response model of the linear motor is no longer a linear system, and thus the measurement of the bandwidth is affected.

Figure 2:
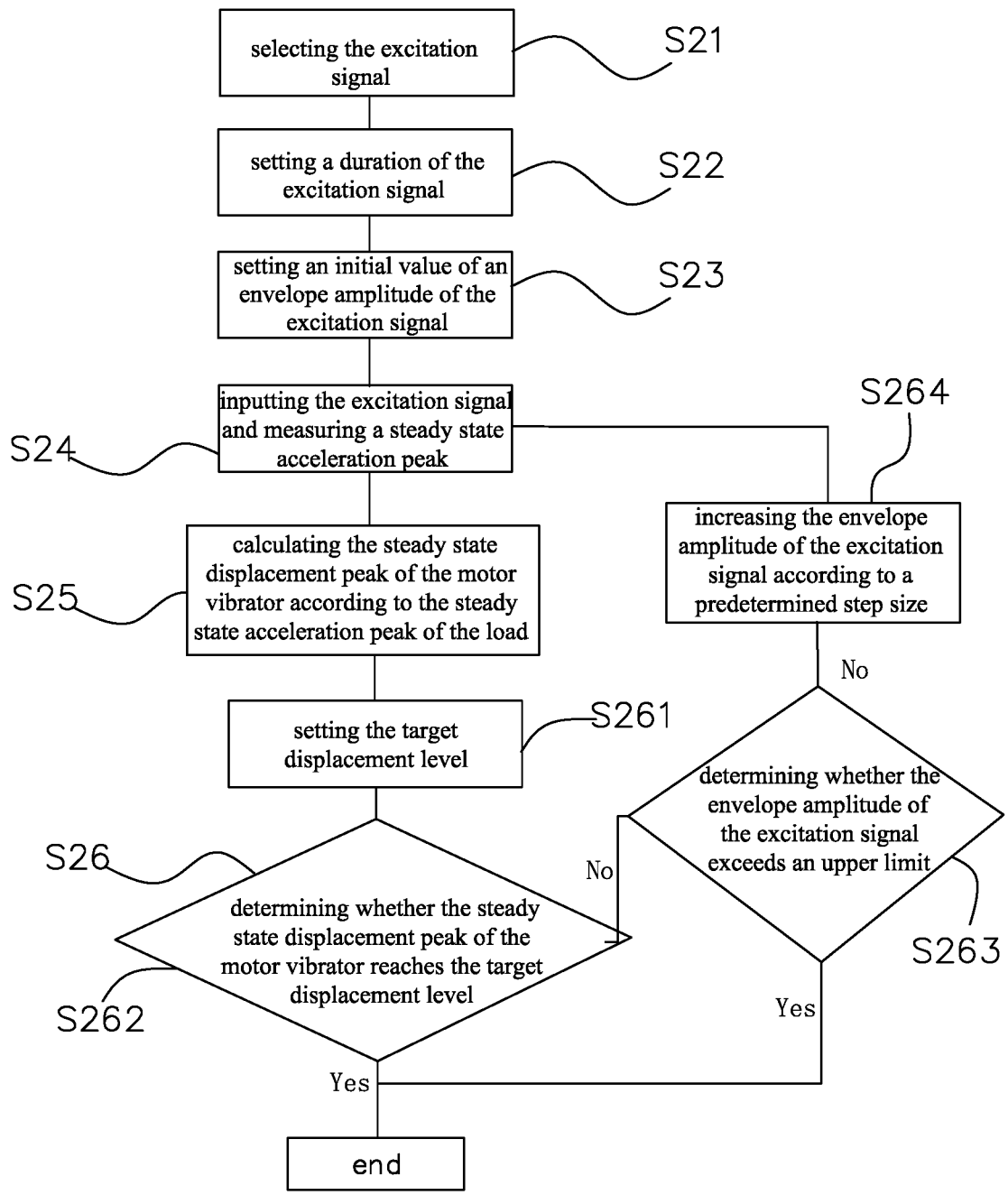
FIG. 2 is a flowchart of a method for measuring a steady state displacement peak of the motor vibrator with reference to a target displacement level at each frequency point.

As shown in FIG. 2, it is a flowchart of a method for measuring a steady state displacement peak of the motor vibrator at each frequency point with reference to the target displacement level in step S2. Specifically, measuring the steady state displacement peak comprises the following steps:

step S21: the excitation signal which can eliminate the overshoot of the linear motor is selected.

In the present embodiment, the excitation signal is composed of a starter signal and a constant envelope sinusoidal signal. The starter signal is configured to smoothly promote amplitude of the signal from zero value to the level of the constant envelope state, so that the excitation signal can effectively eliminate the overshoot phenomenon caused by the non-resonant frequency signal exciting the motor.

Step S22: a duration of the excitation signal is set to enable the vibration of the linear motor to enter a steady state. Since it takes a certain time for the linear motor from a vibration starting state to a steady state, the duration of the excitation signal is required to be an integer multiple of the excitation signal period. Preferably, the duration of the excitation signal is greater than or equal to 30 excitation signal periods, that is, the excitation signal lasts for 30 periods or more. Meanwhile, in order to avoid heating, the duration of the excitation signal should not be too long, or it will cause the motor to heat up, thereby deviating from the linear working area, and affecting the bandwidth test. Preferably, the duration of the excitation signal cannot exceed 1 s.

Step S23: a value of the envelope amplitude of the excitation signal is defined as an initial value, as a basis for later adjustment;

Step S24: a load is connected to the linear motor, wherein the load may be a mobile phone or a tool, the load moves with the movement of the linear motor, the aforementioned excitation signal is inputted to the linear motor, and a steady state acceleration peak of the load is measured by an accelerometer. Preferably, it is necessary to determine whether the acceleration value curve is in a steady state by means of data analysis during the measuring process.

Step S25: the steady state displacement peak of the motor vibrator is estimated according to the steady state acceleration peak obtained in step S24. The specific calculation method is:

The mass of the motor vibrator of the resonant motor is $m_1$, the mass of the load is $m_2$, the acceleration of the motor vibrator is $A_1$, the acceleration of the load is $A_2$, and the relationship between the motor vibrator and the load is: $A_1/A_2=m_2/m_1$. According to the relational expression $A_1=\omega^2 D_1$, the steady state displacement peak $D_1$ of the motor vibrator can be solved.

Step S26: whether the condition for ending the measurement has been reached or not is determined.

Specifically, the step S26 comprises the following steps:
Step S261: a target displacement level is set;
Step S262: whether the steady state displacement value has reached the reference target displacement level is determined, and if the steady state displacement value has reached the reference target displacement level, the measurement is ended; otherwise, entering the step S263;
Step S263: whether the envelope amplitude of the excitation signal has exceeded the upper frequency limit is determined, and if the envelope amplitude of the excitation signal has exceeded the upper frequency limit, the measurement is ended; otherwise, entering the step 264;
Step S264: increase the signal amplitude based on a predetermined step size and repeat the steps S24 and S25.

Figure 3:
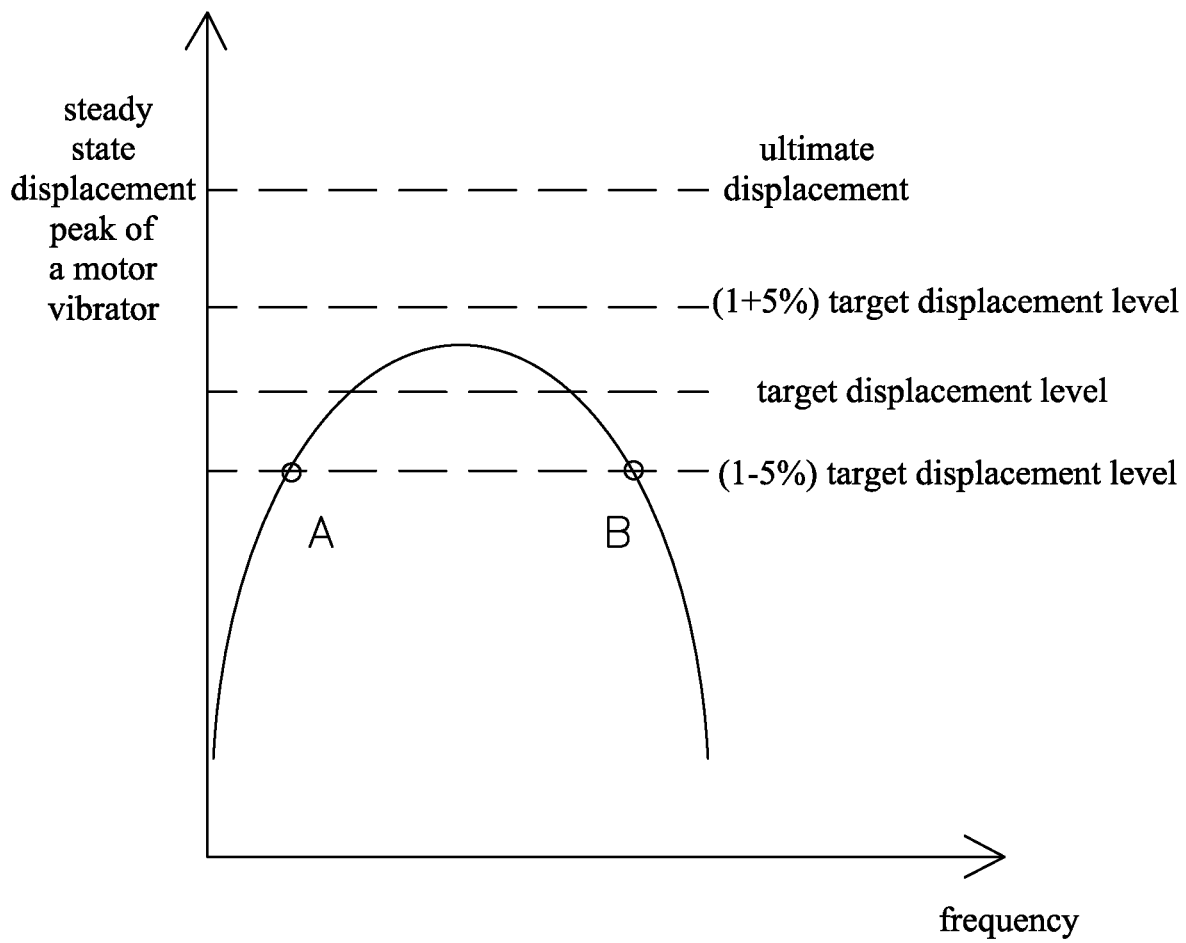
FIG. 3 shows a frequency response curve of the steady state displacement peak of the motor vibrator measured with reference to the target displacement level according to present disclosure.

When measuring the steady state displacement peak of each frequency with reference to the target displacement level is ended, the frequency response curve of the steady state displacement peak of the motor vibrator with reference to target displacement level as shown in FIG. 3 can be obtained. The motor bandwidth with reference to target displacement level can be solved in FIG. 3.

As shown in FIG. 3, in the step S261, the target displacement level is defined as 10%-80% of an ultimate displacement level of the motor vibrator.

According to the frequency response curve of the steady state displacement peak of the motor vibrator shown in FIG. 3, the method for determining the upper frequency limit and the lower frequency limit with reference to the target displacement level comprises:

In a certain frequency band, if the steady state displacement peak of the motor vibrator satisfies the conditional expression: $abs(D_1-D_0)/D_0 \leq 5\%$, a maximum frequency of this frequency band is the upper frequency limit, and a minimum frequency is the lower frequency limit. Where, $D_1$ is the steady state displacement peak of the motor vibrator, $D_0$ is the target displacement level. For example, in FIG. 3, Point A is the lower frequency limit and point B is the upper frequency limit. The bandwidth between the frequency point A and the frequency point B is the bandwidth of the linear motor.

Compared with the prior art, the present disclosure provides a method for measuring the bandwidth of the linear motor, comprising the following steps: step S1: setting a frequency distribution of an excitation signal; step S2: measuring a steady state displacement peak of the motor vibrator at each frequency point of the excitation signal with reference to a target displacement level, and obtaining a frequency response curve with reference to the target displacement level; step S3: determining an upper frequency limit and a lower frequency limit according to the frequency response curve obtained in step S2 with reference to the target displacement level, and obtaining a bandwidth of the linear motor by calculating the difference between the upper frequency limit and the lower frequency limit. The method for measuring the bandwidth of the linear motor provided by the disclosure can solve the common difficulties in the actual measurement operation, simplify the steps, facilitate the measurement and ensure the accuracy of the measurement.

The above is only the embodiment of the present disclosure, but not limit to the patent scope of the present disclosure, and equivalent structures or equivalent process transformations made by utilizing the present disclosure and the contents of the drawings, or directly or indirectly applied to other related technical fields, are all included in the scope of the patent protection of the present disclosure.

What is claimed is:

1. A method for measuring a bandwidth of a linear motor, comprising the following steps:
   step S1: setting a frequency distribution of an excitation signal;
   step S2: measuring a steady state displacement peak of a motor vibrator at each frequency point of the excitation signal with reference to a target displacement level, and obtaining a frequency response curve with reference to the target displacement level;
   step S3: according to the frequency response curve obtained in step S2, determining an upper frequency limit and a lower frequency limit with reference to the target displacement level, and obtaining a bandwidth of the linear motor by calculating a difference between the upper frequency limit and the lower frequency limit.

2. The method for measuring the bandwidth of the linear motor according to claim 1, wherein in step S1, a preset frequency band to be measured is divided into N segments, and N is an integer greater than 1; and in each segment of the frequency band to be measured, setting a frequency starting point, a frequency ending point and an interval between adjacent frequency points of the excitation signal.

3. The method for measuring the bandwidth of the linear motor according to claim 1, wherein in step S2, the method for measuring the steady state displacement peak of the motor vibrator at each frequency point with reference to the target displacement level comprises the following steps:
   step S21: selecting the excitation signal which can eliminate an overshoot phenomenon of the linear motor;
   step S22: setting a duration of the excitation signal to enable the vibration of the linear motor to enter into a steady state;
   step S23: setting an initial value of an envelope amplitude of the excitation signal;

step S24: connecting a load to the linear motor, and inputting the excitation signal into the linear motor, and measuring a steady state acceleration peak of the load by an accelerometer;

step S25: calculating the steady state displacement peak of the motor vibrator according to the steady state acceleration peak of the load obtained in step S24;

step S26: determining whether a condition for ending measurement reach or not, and if reaching the measurement condition, the measurement is ended, otherwise the steps S24 and S25 is repeated.

4. The method for measuring the bandwidth of the linear motor according to claim 3, wherein the excitation signal in the step S21 is composed of a starter signal and a constant envelope sinusoidal signal.

5. The method for measuring the bandwidth of the linear motor according to claim 3, wherein in the step S25 the method for calculating the steady state displacement peak of the motor vibrator comprises:

According to formulas: $A_1/A_2=m_2/m_1$ and $A_1=\omega^2 D_1$, calculating the steady state displacement peak of the motor vibrator, where, $m_1$ is a mass of the motor vibrator in the linear motor, $m_2$ is a mass of the load, $A_1$ is an acceleration of the motor vibrator, $A_2$ is an acceleration of the load, and $D_1$ is the steady state displacement peak of the motor vibrator.

6. The method for measuring the bandwidth of the linear motor according to claim 3, wherein the duration of the excitation signal in the step S22 is an integer multiple of an excitation signal period.

7. The method for measuring the bandwidth of the linear motor according to claim 6, wherein the duration of the excitation signal in the step S22 is greater than or equal to 30 excitation signal periods and less than 1 s.

8. The method for measuring the bandwidth of the linear motor according to claim 3, wherein the step S26 comprises the following steps:

step S261: setting the target displacement level;

step S262: determining whether the steady state displacement peak of the motor vibrator reaches the target displacement level, and if the steady state displacement peak of the motor vibrator reaches the target displacement level, the measurement is ended; otherwise, entering the step S263;

step S263: determining whether the envelope amplitude of the excitation signal exceeds an upper limit, and if the envelope amplitude of the excitation signal exceeds the upper limit, the measurement is ended; otherwise, entering the step 264;

step S264: increasing the envelope amplitude of the excitation signal according to a predetermined step size and repeating the steps S24 and S25.

9. The method for measuring the bandwidth of the linear motor according to claim 8, wherein in step S261, the target displacement level is defined as 10%-80% of an ultimate displacement level of the motor vibrator.

10. The method for measuring the bandwidth of the linear motor according to claim 1, wherein in step S3, with reference to the target displacement level, the method of determining the upper frequency limit and the lower frequency limit comprises:

in a certain frequency band, if the steady state displacement peak of the motor vibrator satisfies the conditional expression: $abs(D_1-D_0)/D_0 \leq 5\%$, a maximum frequency of the frequency band is the upper frequency limit, and a minimum frequency is the lower frequency limit, where, $D_1$ is the steady state displacement peak of the motor vibrator, and $D_0$ is the target displacement level.

* * * * *